United States Patent [19]

Whetsel

[11] Patent Number: 5,710,779
[45] Date of Patent: Jan. 20, 1998

[54] REAL TIME DATA OBSERVATION METHOD AND APPARATUS

[75] Inventor: Lee D. Whetsel, Allen, Tex.

[73] Assignee: Texas Instruments Incorporated, Dallas, Tex.

[21] Appl. No.: 643,444

[22] Filed: May 8, 1996

Related U.S. Application Data

[63] Continuation-in-part of Ser. No. 629,654, Apr. 9, 1996.

[51] Int. Cl.⁶ .................................................. G06F 11/00
[52] U.S. Cl. ............................. 371/22.3; 395/183.06
[58] Field of Search ............................ 371/22.3, 22.5, 371/22.6; 395/183.06; 324/158.1, 158 R

[56] References Cited

U.S. PATENT DOCUMENTS

| | | |
|---|---|---|
| 4,872,169 | 10/1989 | Whetsel, Jr. |
| 5,257,267 | 10/1993 | Ishizaka |
| 5,467,354 | 11/1995 | Yamauchi ............................ 371/22.3 |
| 5,477,545 | 12/1995 | Huang ............................ 371/22.3 |
| 5,513,186 | 4/1996 | Levitt |
| 5,528,610 | 6/1996 | Edler et al. |
| 5,550,843 | 8/1996 | Yee |
| 5,570,375 | 10/1996 | Tsai et al. |

OTHER PUBLICATIONS

IEEE, Inc., IEEE Computer Society; IEEE Standard Text Access Port and Boundary–Scan Architecture—(IEEE Std. 1149.1–1990 (Includes IEEE Std 1149.1a–1993)); Oct. 21, 1993; pp. 10–38, 10–39 and 10–40.

Paul H. Bardell, Jacob A. Abraham, William H. McAnney and Jacob Savir, "Built–In Test Theory and Implementations", 1985, pp. 103–107.

Texas Instrument's TGC 1000/TEC 1000 CMOS Arrays Design Manual, "Application Specific Integrated Circuits", 2582018–9761 Revision C, Aug. 1993, pp. 5–10–5–13.

*Primary Examiner*—Vincent P. Canney
*Attorney, Agent, or Firm*—Scott B. Stahl; W. James Brady, III; Richard L. Donaldson

[57] ABSTRACT

A scan cell design includes a bypass mode in which the scan input (SI) of the cell is connected directly to the scan output of the cell by a connection that bypasses the scan memory (M1) of the cell.

23 Claims, 10 Drawing Sheets

REAL TIME DATA OBSERVATION METHOD AND APPARATUS

This is a continuation-in-part of U.S. Ser. No. 08/629,654 Docket No. TI-22688, filed on Apr. 9, 1996.

FIELD OF THE INVENTION

The invention relates to test and evaluation of integrated circuit (IC) operation and, more particularly, to real time observation of selected nodes of an integrated circuit.

BACKGROUND OF THE INVENTION

Figure 1:
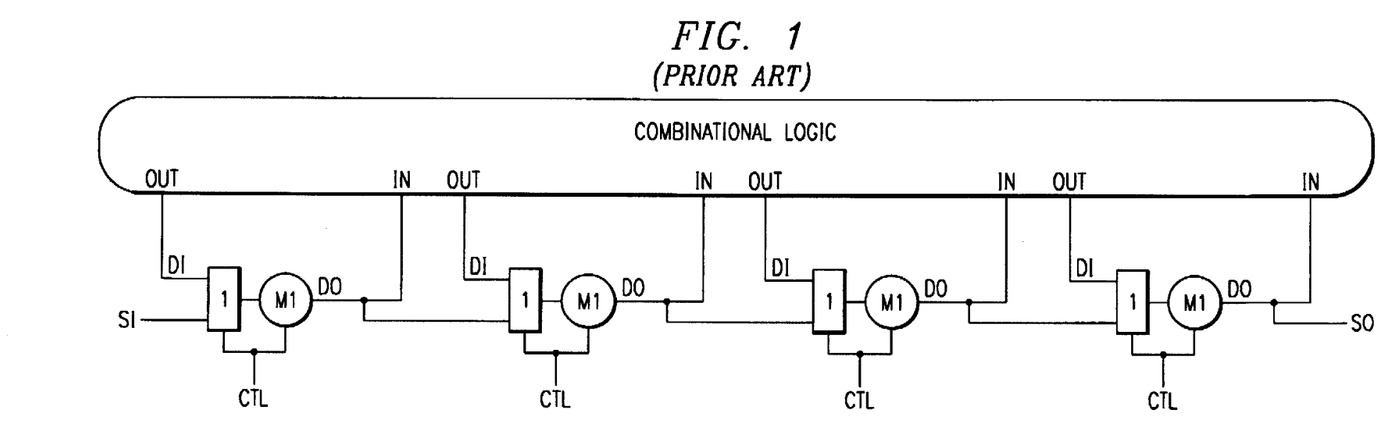
FIGS. 1–4 illustrate conventional scan cell arrangements.

FIG. 1 illustrates what is commonly called full scan design. In this conventional scan design style, all functional memories (flip flops/latches) of an IC are separated from combinational logic and are made scannable by including a multiplexer (1) in front of each memory (M1). Since functional memories are shared for test, this scan design style has very low test circuit overhead. During functional operation, the multiplexer connects M1 to combinational logic to complete the circuit. During test operation the multiplexer allows M1 to capture data from the combinational logic, shift data between M1s, and output data to the combinational logic. During test the circuit is not functional since the multiplexer breaks the normal connection between M1 and the combinational logic during shift (scan) operations. Testing of the combinational logic is accomplished by these capture, shift, and output steps. Control input (CTL) to operate M1 and multiplexer 1 in test mode typically comes from a serial test bus interface on the IC, such as the IEEE 1149.1 test access port (TAP).

In microprocessors, microcontrollers, and digital signal processors, for example, the full scan design of FIG. 1 can be used for emulation operations. In such emulation operations, the steps of (1) scanning the scan path to load state data, (2) enabling the processor to execute for a predetermined period of time, (3) halting the processor, and (4) scanning the scan path to examine the internal states of the processor, are typically repeated. Such emulation operations are particularly useful when developing program code to be executed by the processor.

Figure 2:
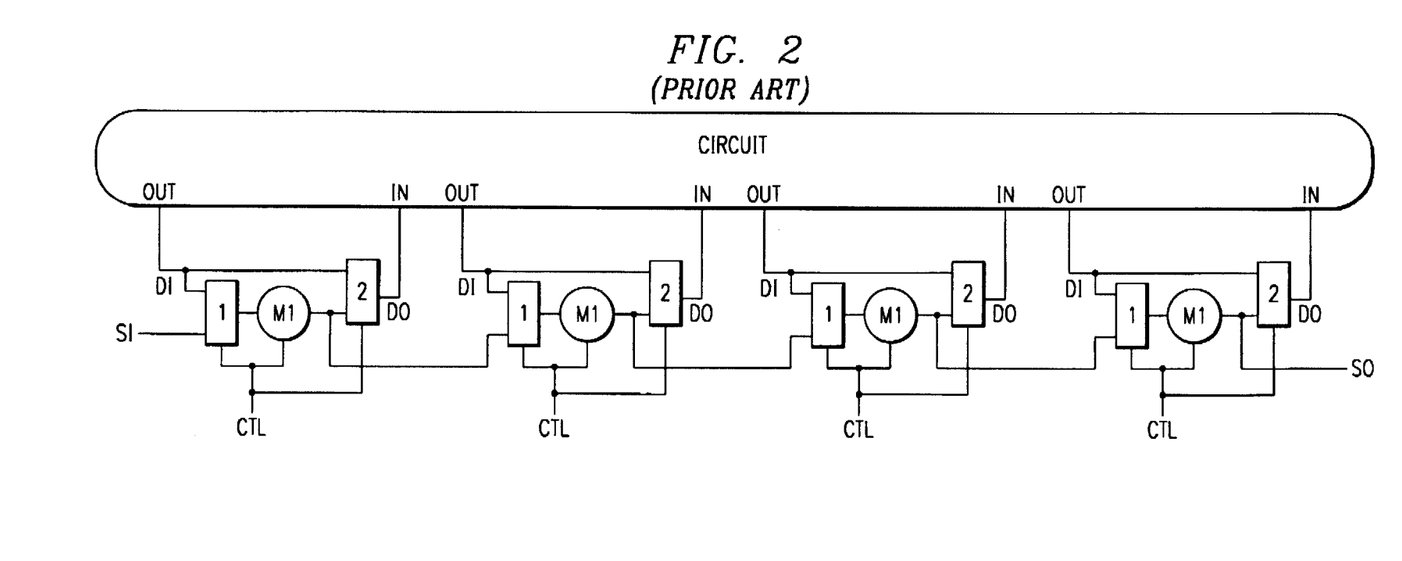

FIG. 2 illustrates a different conventional scan approach whereby the scan cells are basically placed or inserted into functional signal paths of a circuit. The logic associated with these scan cells are dedicated to test and not shared for functional purposes. During normal operation the scan cells make the functional circuit connections by the DI to DO path shown through multiplexer 2. While in functional mode the scan cell can capture and shift out data without disturbing normal operation of the circuit since their M1s are not used functionally. When placed in test mode, the functional path between DI and DO is broken and the output of M1 is input to the circuit input via multiplexer 2. Testing is similar to that described in FIG. 1. An additional control signal is required to operate multiplexer 2.

Figure 3:
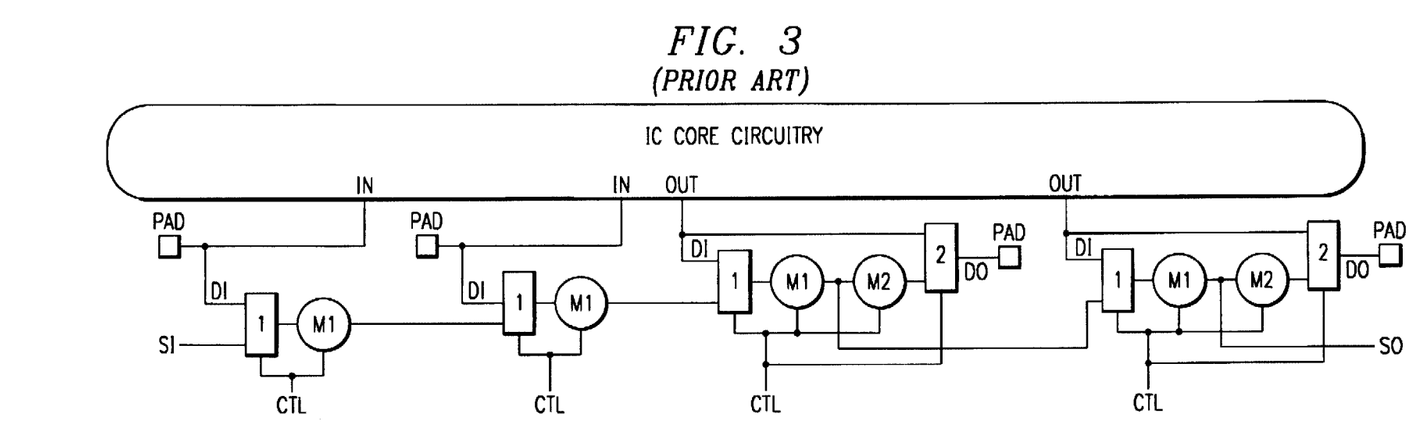
Figure 4:
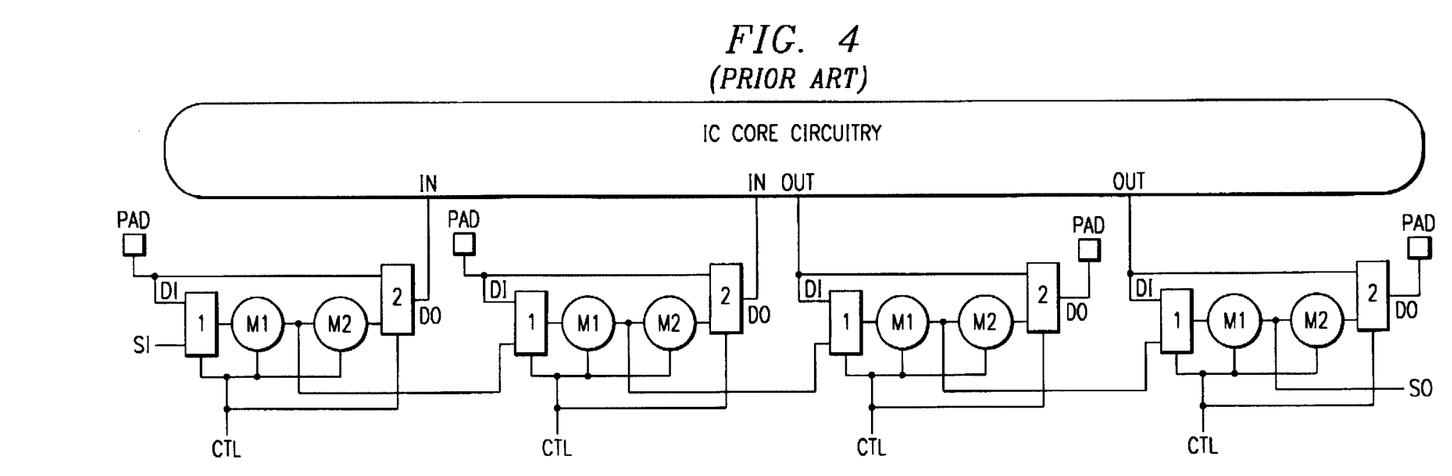

FIGS. 3 and 4 illustrate conventional boundary scan approaches. Boundary scan applies scan cells between the IC's I/O pads and core circuitry. During functional mode the boundary scan cells allow normal I/O operation. While the IC is in normal mode the boundary scan cells can be controlled to capture and shift out data since they are dedicated test logic. During test mode the normal mode of the IC is disabled and the boundary scan cells are used to capture and shift out data from input pads and shift in and output data to output pads. The input boundary scan cells of FIG. 3 only allow capture and shift out operations at input pads, i.e. no output capability. The input boundary scan cells of FIG. 4 additionally provide for shifting in and outputting data to the core logic. Boundary scan cells that output data require the data to be held during shift operations. Such boundary scan cells require a second memory (M2) which is used to hold data to the core/pad until M1 inputs new data to M2.

In summary, scan path design is a common test technique for integrated circuits. Scan paths are made by serially connecting a number of scan cells. The scan cells are used to test functional circuits within ICs or to perform boundary scan testing at the I/O of ICs. To test, scan cells must be coupled to internal circuit nodes or to I/O pads of ICs. To access scan cells, a serial scan path and a control path are routed to each scan cell.

The present invention takes advantage of the fact that, (1) scan cells are connected by a serial scan and control path routed through the IC, and (2) scan cells are coupled to internal nodes and/or to I/O pads of the IC. The invention adds a small mount of circuitry to modify existing scan cells to enable them to selectively output real time internal node or I/O pad signal activity. The ability to select a node or I/O pad associated with a scan cell and route that signal off chip enables many forms of testing that today are not possible. Because the invention makes use of existing scan path routing and scan cell circuitry, the overhead of the approach is low.

DETAILED DESCRIPTION

Figure 5:
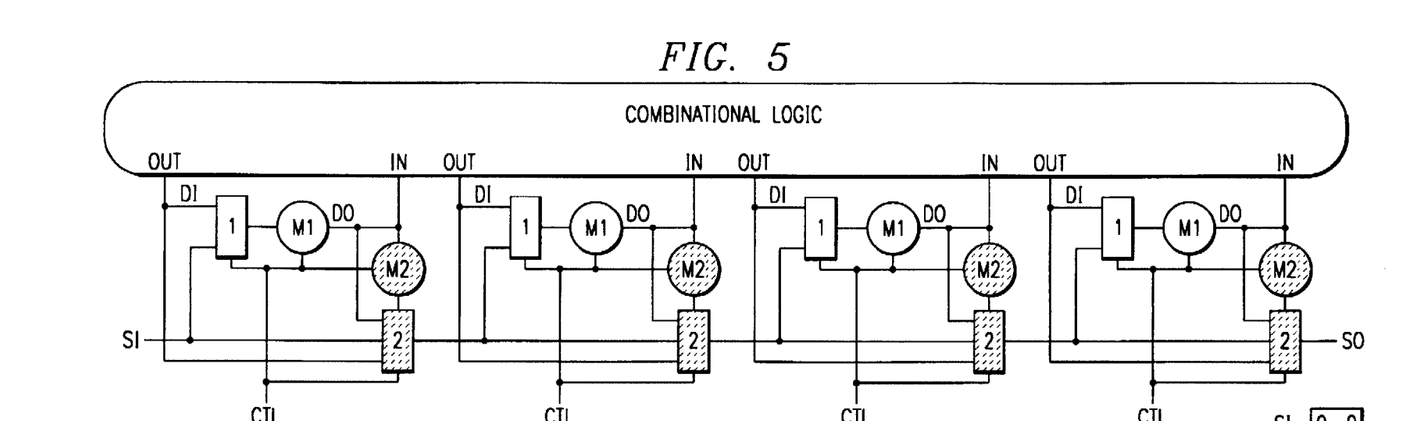
FIGS. 5 and 6 illustrate exemplary internal scan designs according to the present invention.

Exemplary FIG. 5 shows how the scan cells of FIG. 1 can be upgraded with a small amount of circuitry to realize the invention. The added circuitry, shown shaded, includes a second memory (M2) and multiplexer 2. M2 is loaded from the M1 following a scan operation. Data in M2 and control from CTL determines which input to multiplexer 2 is output from multiplexer 2. During scan operations, CTL always forces multiplexer 2 to output data DO from M1 to the next scan cell's SI (scan) input. While scanning is not being performed, CTL is released (inactive) to allow the multiplexer 2 to be programmed by data from M2 to select either SI or DI to be output from multiplexer 2. If programmed to output DI, the OUT node for the combinational logic will be output from Multiplexer 2, otherwise SI is output. If OUT is selected, the scan cell is in observation mode and will pass signal activity on the OUT node to the next sc an cell's SI input. If SI is selected, the scan cell is in bypass mode and will pass the SI input to the next scan cell's SI input.

In the scan path of FIG. 5 it is seen that if the first (leftmost) scan cell is programmed to be in observation mode and the following scan cells are programmed to be in bypass mode, the OUT signal associated with the first scan cell will be passed through the scan path to the scan path's SO output. Further it is seen that if the second scan cell is in observation mode and the following scan cells are in bypass mode, the OUT signal associated with the second scan cell will be passed to SO. This process of placing a selected scan cell in observation mode while other scan cells are placed in bypass mode enables real time observation at SO of any signal node associated with a scan cell in an IC.

The overhead of this approach relative to FIG. 1 is low because the observation occurs over existing scan path wire routing and the circuit area added to each scan cell is small (M2 & multiplexer 2). M2 is required in the full scan design of FIG. 5 because M1 is functionally used and therefore cannot be used as a programming input to multiplexer 2. The ability to select and examine the real time operation of every node associated with a scan cell in an IC is realized by this small amount of overhead.

The present invention allows IC manufacturers to use the scan path for traditional scan testing, and then reuse the scan path as an embedded real time observation structure to view internal activity at each circuit node associated with a scan cell. The ability to use the invention to select and observe internal nodes of an IC while the IC is being functionally tested on a tester provides a new type of testing that improves an IC manufacturer's ability to detect and diagnose at-speed functional failures. Such tests can be repeated after ICs have been assembled onto boards.

Another benefit of the invention relates to emulation. In traditional emulation as described above, state data observation is only available at the end of execution via the scan out operation. However, the present invention allows state data visibility during execution as well. The ability to view a selected node within an IC during execution adds a new dimension to the prior art of emulation.

To use the invention in the full scan design of FIG. 5 for at-speed visibility of internal nodes during functional testing or during emulation requires a special scan operation be defined. This scan operation, referred to as observation/bypass data scan, is different from other scans in that it causes data scanned into the M1s to be updated into the M2s. Other scan operations do not update data from M1 into M2.

In FIG. 5, it is seen that the M1s serve three purposes. First, they serve as functional memories for the IC. Second, they serve as scan memories for traditional test and emulation operations. Third, they serve as input memories from which to load observation/bypass data into the M2s. The observation/bypass data scan allows loading (updating) the M2s with a pattern used to select the node to be observed. After loading the observation/bypass pattern into the M2s, another scan operation is required to load into the M1s the starting data state from which the IC will begin executing. Since the starting state pattern is the last pattern scanned into the M1s before the test or emulation operation begins, that pattern is not updated from M1 to M2 because this would write over the previously established observations/bypass pattern in the M2s.

Figures 6, 6A:
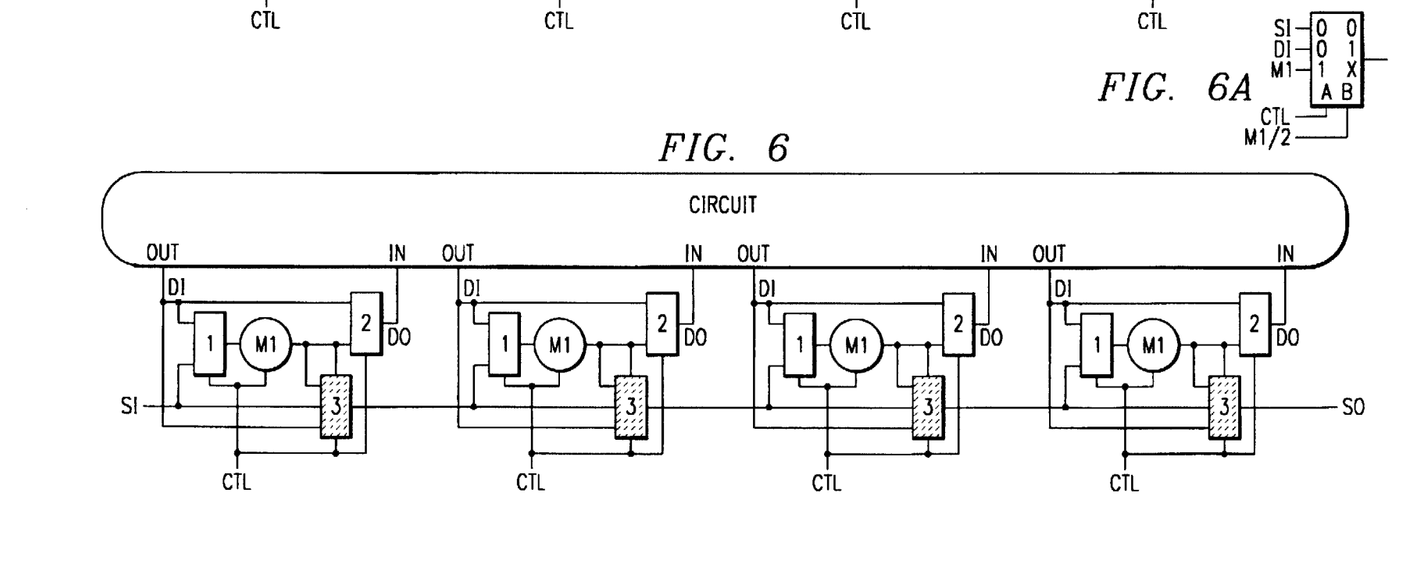
FIG. 6A illustrates a multiplexer of FIGS. 5–6.

Exemplary FIG. 6 illustrates the addition of multiplexer 3 to the scan cell of FIG. 2 to realize another embodiment of the invention. The reason only multiplexer 3 is required is that M1 can be used, while the IC is in normal functional mode, to program multiplexer 3. Except for M1 substituting for M2, the structure and operation of the added circuitry is the some as that described in FIG. 5. Also the some benefits as described in FIG. 5 apply to the scan cell arrangement of FIG. 6. It is important to note that since the scan cell circuitry of FIG. 6 is dedicated for test, the function of the circuit is not disabled during scans that set up testing or observation functions.

FIG. 6A illustrates a multiplexer that could serve as multiplexer 2 of FIG. 5 or multiplexer 3 of FIG. 6. During scan operations, CTL input forces the output of M1 to the multiplexer output. During non-scan times, CTL is released to allow the data in M1 (FIG. 6) or M2 (FIG. 5) to program the multiplexer to output either SI or DI.

Figure 7:
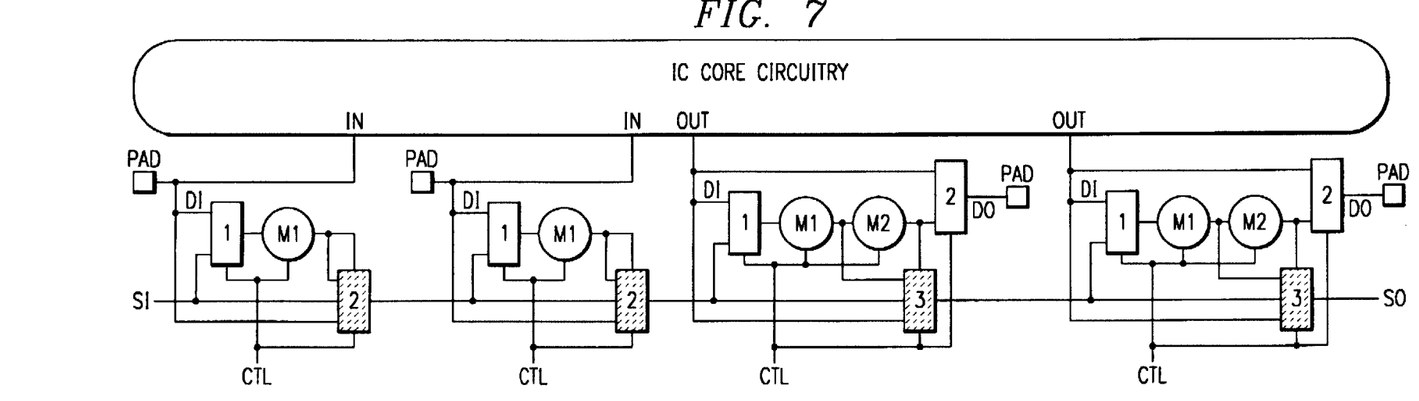
FIGS. 7 and 8 illustrate exemplary boundary scan designs according to the present invention.
Figure 8:
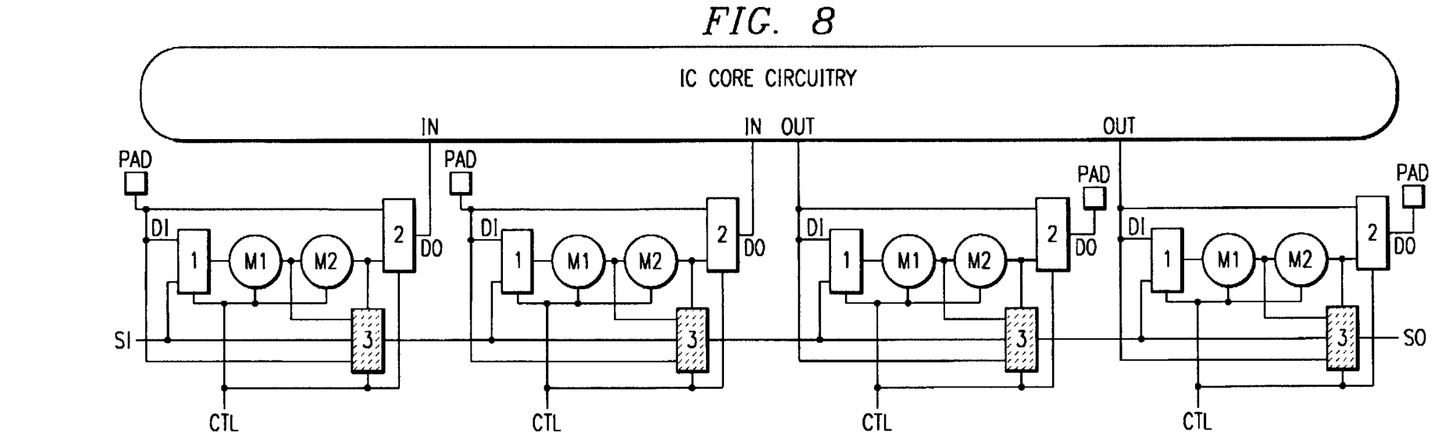

Exemplary FIGS. 7 and 8 illustrate the invention being applied to boundary scan design styles. In both figures, a multiplexer 2 or 3 provides the boundary scan cells with observation mode and bypass mode. The input boundary scan cells of FIG. 7 reuse test memory M1 to program the added multiplexer 2 as described in FIG. 6. The output boundary scan cells of FIG. 7 reuse test memory M2 to program the added multiplexer 3. The input and output boundary scan cells of FIG. 8 both reuse test memory M2 to program the added multiplexer 3. The structure and operation of the observation circuitry is the same as previously described. Like the scan cells of FIG. 6, the boundary scan cells of FIGS. 7–8 are dedicated for testing, and scanning can be performed to set up real time pad observation without disabling the IC.

Designers/manufacturers can use the boundary scan path of FIGS. 7–8 for traditional IC to IC interconnect testing and then reuse the boundary scan path as an embedded real time I/O observation structure to view signal activity at each IC pad. This capability adds value to the manufacturer's IC since it provides system designers with way to view the IC's I/O activity in real time. It is almost equivalent to having a logic analyzer coupled to each IC pin. The invention is useful in fielded systems where its on-line monitoring method can be use to detect early indications of system problems. Also the invention can be used as an aid to repairing and maintaining systems. Further the invention can be used to provide on-line I/O visibility during system software debug, system emulation, and hardware/software integration.

Figure 9A:
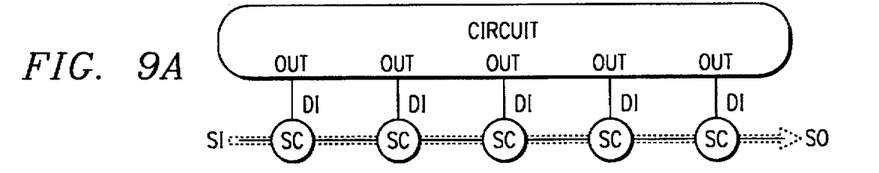
FIGS. 9A–9F illustrate the observation capability provided by the internal scan designs of FIGS. 5–6.
Figure 9B:
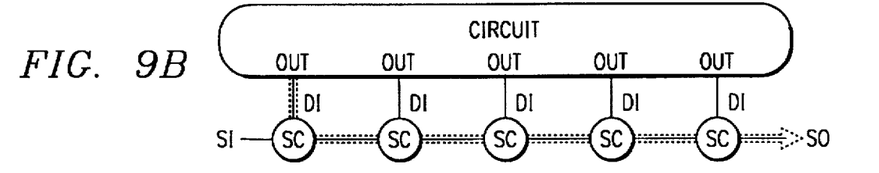
Figure 9C:
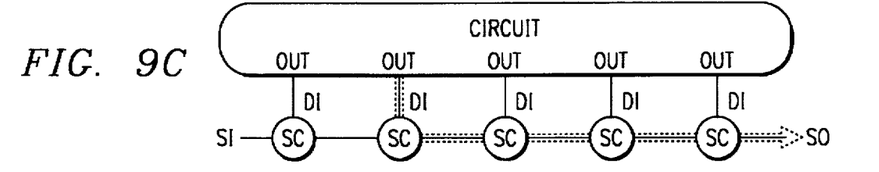
Figure 9D:
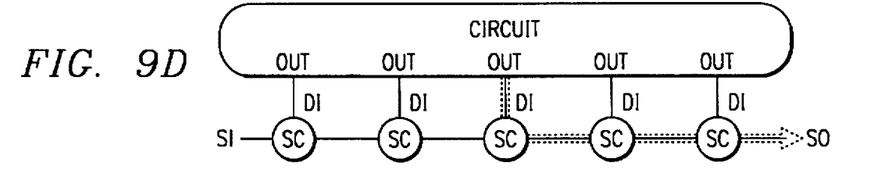
Figure 9E:
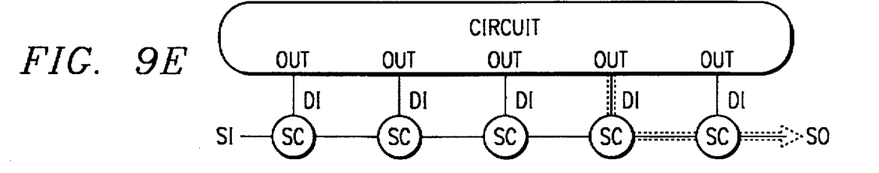
Figure 9F:
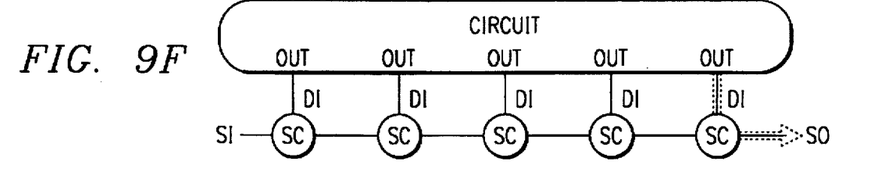

FIGS. 9A through 9F illustrate the observation capability provided by the internal scan path designs of FIGS. 5 and 6. FIG. 9A shows the data path flow between the serial input (SI) and serial output (SO) of the IC scan path when all scan cells (SC) are in their bypass mode. FIG. 9B shows the first scan cell set up in its observation mode while the other scan cells are in bypass mode. FIGS. 9C–9F show that all nodes associated with all scan cells can be made observable at the serial output.

Figure 10A:
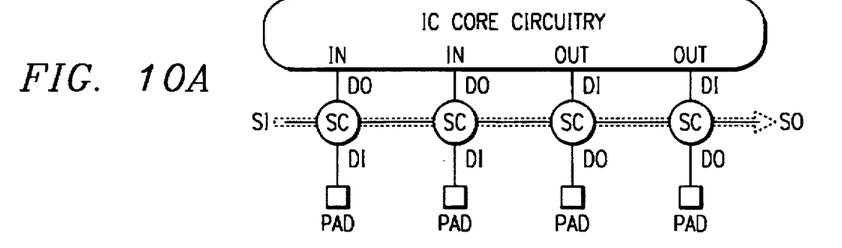
FIGS. 10A–10E illustrate the observation capability provided by the boundary scan designs of FIGS. 7–8.
Figure 10B:
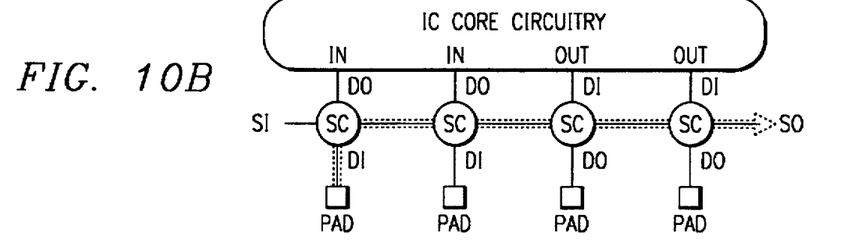
Figure 10C:
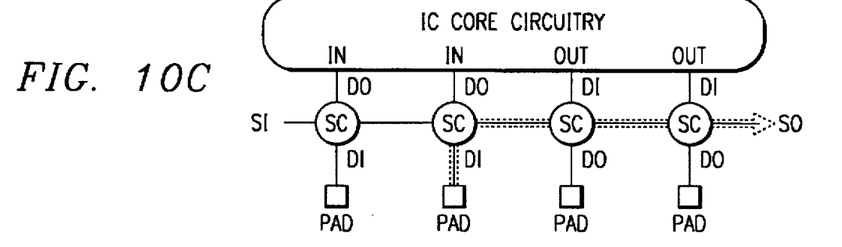
Figure 10D:
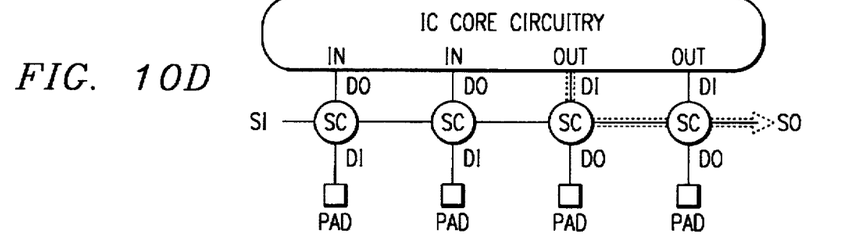
Figure 10E:
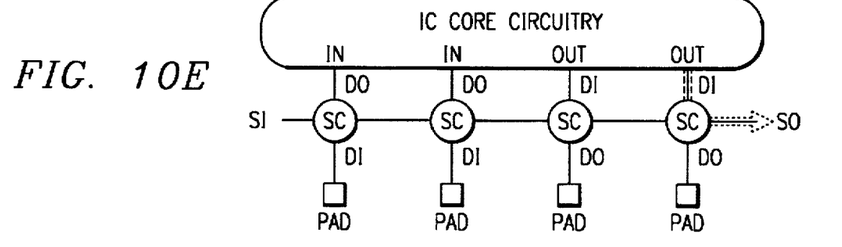

FIGS. 10A through 10E illustrate the observation capability provided by the boundary scan designs styles of FIGS. 7 and 8. FIG. 10A shows the data path flow between the serial input (SI) and serial output; (SO) of the IC boundary scan path when all scan cells (SC) are in their bypass mode. FIG. 10B shows the first scan cell setup in its input pad observation mode while the other scan cells are in bypass mode. FIGS. 10C–10E show that all input and output pads associated with boundary scan cells can be made observable at the serial output.

Figure 11:
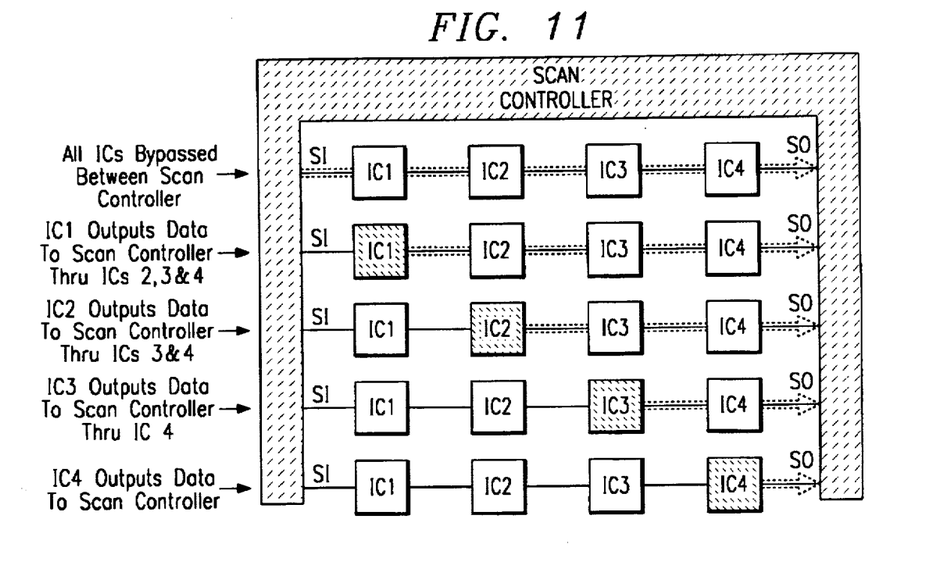
FIG. 11 is a board-level example of the observation capability of the present invention.

FIG. 11 illustrates conceptually the steps of how a scan controller would access a series of ICs (1-4) on a board using the observation feature of the invention. In the first step the scan controller flushes data through the scan path of the ICs, which are in the bypass mode of the invention. The second step shows the scan controller having setup IC1 for observation of its I/O pads and/or internal nodes while the other ICs are in bypass mode. In this arrangement, any node or I/O pad of IC1 can be selected for observation and output to the scan controller via ICs 2,3 & 4. The other steps simply indicate how each remaining IC in the scan path is accessed for real time observation.

Figure 12:
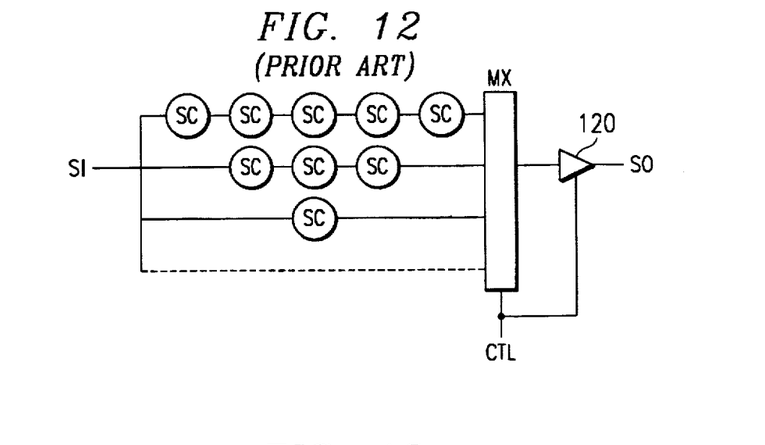
FIG. 12 illustrates a prior art arrangement of scan paths in an integrated circuit.

FIG. 12 illustrates a conventional parallel arrangement of scan paths inside an IC. The IEEE 1149.1 Boundary Scan Standard teaches the use of such parallel scan path arrangements. MX in FIG. 12 designates a multiplexer. A straight wired connection between SI and SO, is indicated by broken line. If the straight wired connection between SI and SO is available, the observation signal being input to SI from a leading IC could simply go to SO through the wire rather than through a scan cell (or cells) in bypass mode. Use of the invention in IEEE 1149.1 architectures requires that the serial output buffer 120 not be 3-stated during times when the observation and bypass modes are used, since this would block the signal flow through ICs in the scan path.

Figure 13:
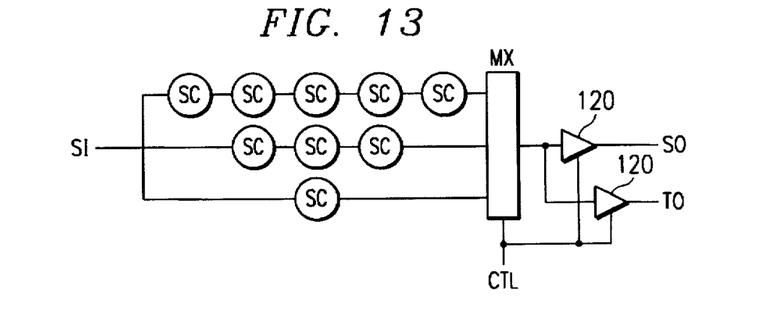
FIGS. 13–14 illustrate a bussed test output feature according to the present invention.

FIG. 13 illustrates an alternate way to transmit data from the IC during observation and bypass modes. An additional test output pin (or terminal) TO is added to the IC to output data during observation and bypass modes of a selected scan path. The TO pin is 3-state so that multiple ICs can have a bussed TO connection at the board level. The TO pin provides an improvement over using SO in that the TO pin can be directly wired to a scan controller, i.e. the data during observation does not have to be passed through other ICs in the scan path as was shown in FIG. 11. Passing the observation data through many ICs can delay the data arrival to the scan controller. Using TO, the data would be output from the IC directly to the scan controller.

Figure 14:
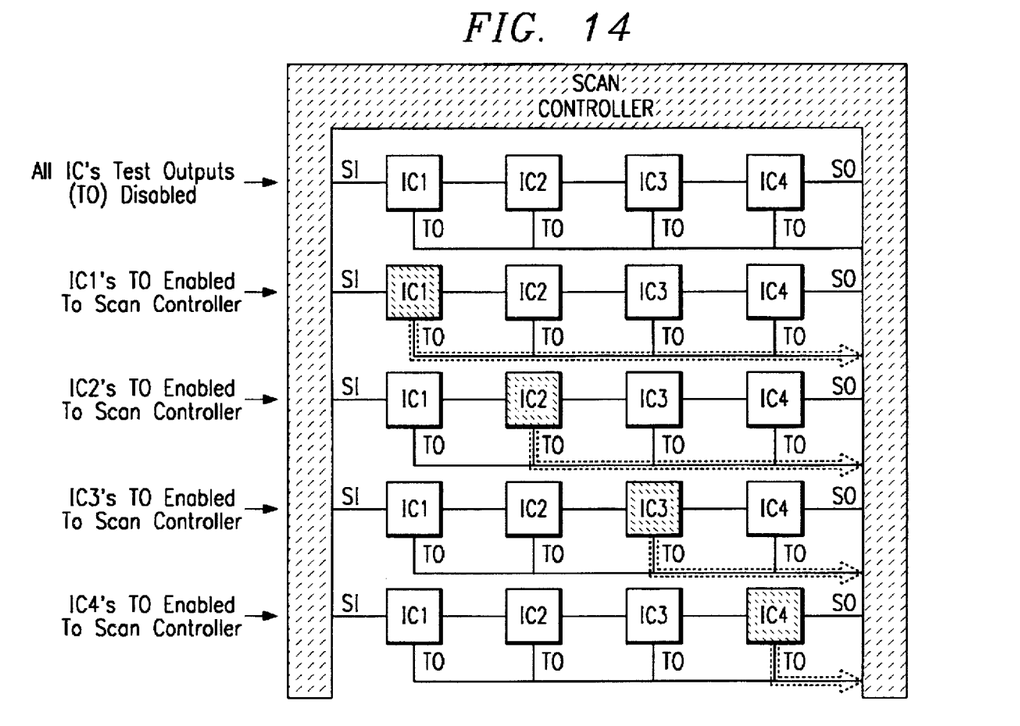

FIG. 14 illustrates conceptually the steps of how a scan controller would access a series of ICs (1-4) on a board using the observation feature of the invention and the TO pin. In the first step, the TO's of all ICs are disabled. The second step shows the scan controller having set up IC1 for observation of its I/O pads and/or internal nodes using TO while the TO's of the other ICs are disabled. In this arrangement, the data from an internal node or I/O pad of IC1 can be selected for observation and output directly on TO to the scan controller, whereas the data in FIG. 11 had to pass through each trailing IC in the can path. The other steps simply indicate the enabling of TO real time observation of each remaining IC in the scan path.

Figure 15:
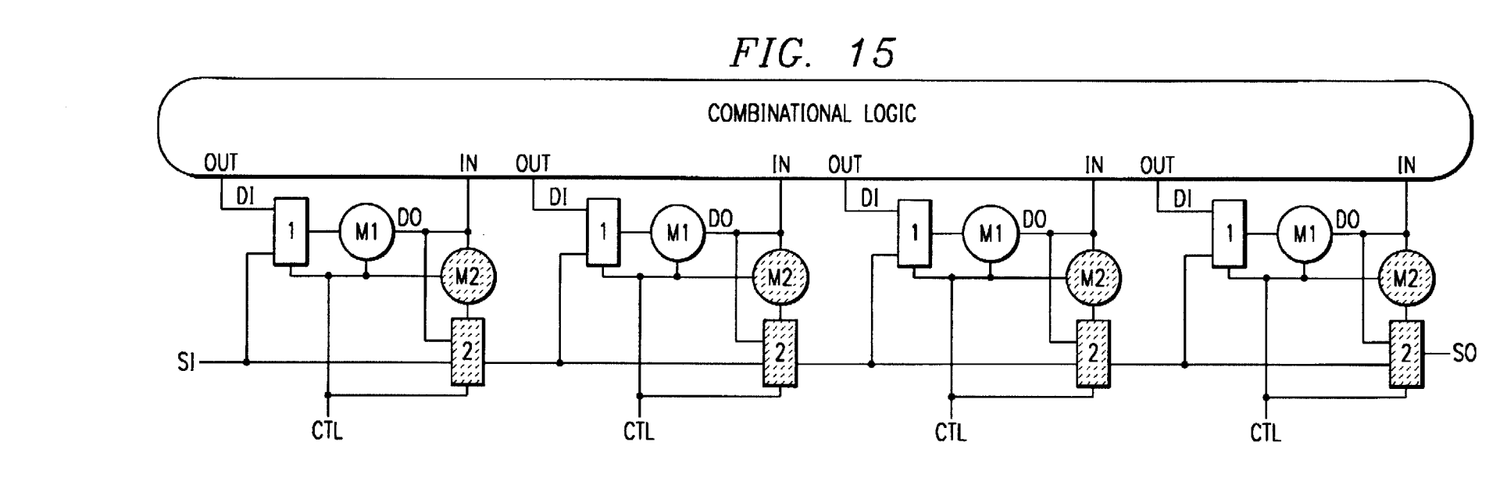
FIG. 15 illustrates an exemplary alternative to the internal scan design of FIG. 5.
Figure 15A:
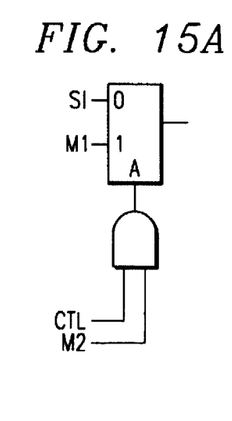
FIG. 15A illustrates a multiplexer of FIG. 15.

Exemplary FIG. 15 shows an alternative to the scan design of FIG. 5. This alternate design provides advantages in the amount of circuitry required. Like FIG. 5, the FIG. 15 scan cells include a second memory (M2) and a multiplexer 2. Also, M2 is loaded from the M1 during an observation/bypass scan operation and the output from M2 controls which input to multiplexer 2 is output from multiplexer 2. During scan operations, CTL always forces multiplexer 2 to output data from M1 to the next scan cell's SI input. While scanning is not being performed, CTL is released to allow the multiplexer 2 to be programmed by data from M2 to select either SI or M1 data to be output from multiplexer 2 (see AND gate in FIG. 15A). If programmed to output M1 data, the IN node to the combinational logic will be output from Multiplexer 2, otherwise SI is output. If IN is selected, the scan cell is in observation mode and will pass signal activity on the IN node to the next scan cell's SI input. If SI is selected, the scan cell is in bypass mode and will pass the SI input to the next scan cell's SI input.

Multiplexer 2 of FIG. 15 is only required to be a two input multiplexer compared to the 3 input multiplexer of FIG. 5. This reduces the multiplexer circuitry by approximately 33%. The reason a two input multiplexer can be used in FIG. 15 is that the IN node to the combinational logic is selected to be the observation point, instead of the OUT node from the combinational logic in FIG. 5. Since the M1 output is already an input to the multiplexer, and since the M1 output is the IN node to the combinational logic, observation of the IN node instead of the OUT node eliminates a multiplexer input. The operation of the observation method is otherwise the same as previously described. This savings in multiplexer circuitry is important in full scan designs, like FIG. 1, because potentially thousands or tens of thousands of nodes will be associated with respective M1s. If a three input multiplexer were used instead of the two input multiplexer, the additional circuitry required to achieve the observation capability of the invention would increase by approximately 33% on each node. This 33% increase would be multiplied by the number of nodes in the circuitry, which as mentioned could be in the thousands.

Figure 15B:
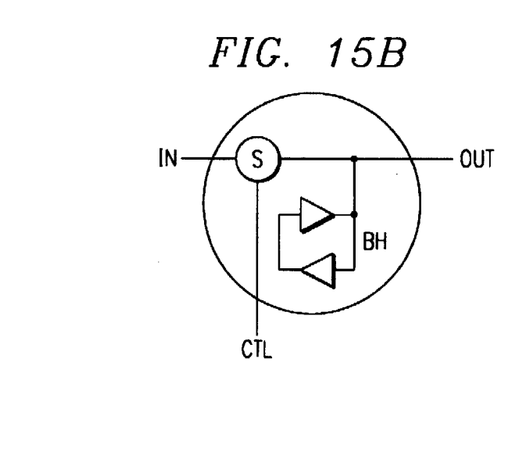
FIG. 15B illustrates a memory element of FIG. 15.

Also shown in FIG. 15B is an example of a memory that can serve as M2. Since M2's have a minimal output load and since performance is not an important factor in the design, a switch (S) and bus holder (BH) can serve as M2. The switch is momentarily closed during each observation/bypass scan operation to input control to multiplexer 2. After the switch opens, the bus holder maintains the control to multiplexer 2. Again, minimizing the circuitry of M2 is important since, in full scan designs, an M2 will be required to be added to each IN node of the circuit. The circuitry of M2 and multiplexer 2 could be further reduced by integrating them into one optimized circuit.

While the approach of the invention has been shown as it would apply to accessing data for testing, it should be clear that this approach could be used to access data for other purposes as well.

Figure 16:
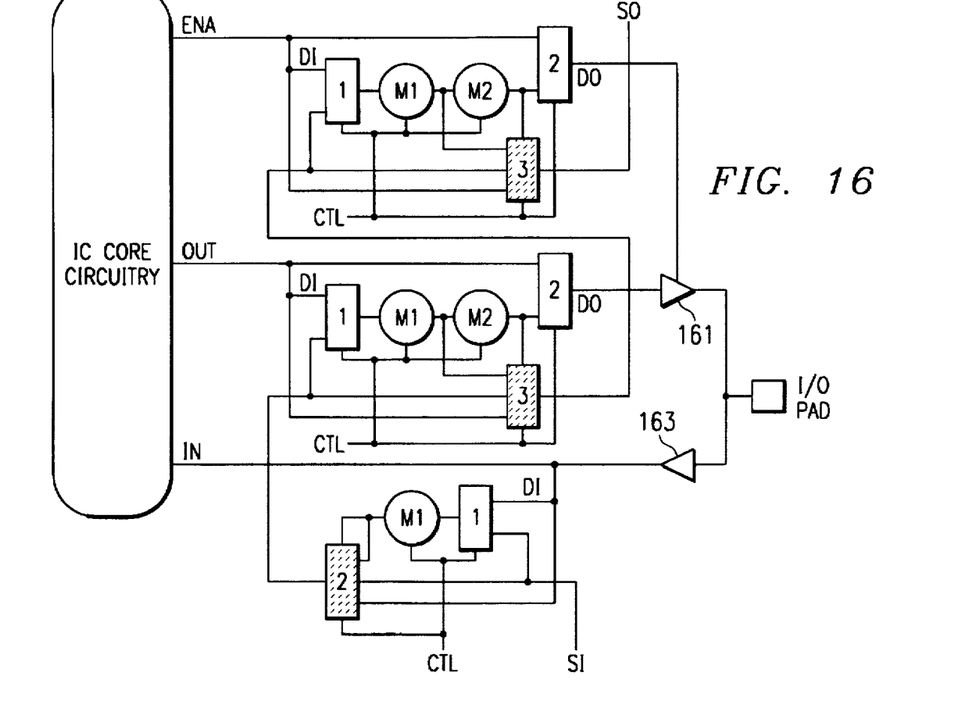
FIGS. 16 and 17 illustrate further exemplary boundary scan designs according to the invention.

Exemplary FIG. 16 shows boundary scan cells placed on a bi-directional (I/O) pad of an IC. The IC core circuitry has an enable output (ENA) which controls the 3-state output buffer 161 connected to the I/O pad, a data output (OUT) which drives the I/O pad when the 3-state output buffer is enabled, and an input (IN) which receives data from the I/O pad via input buffer 163. The boundary scan cells on the ENA, OUT, and IN paths each include the real time data observation and bypass features as described in the boundary scan cells of FIGS. 7 and 8. The input and output buffers are shown in FIG. 16 to indicate the I/O operation. For simplicity, the input and output buffers were not shown in the previous example Figures, but it should be understood that they exist.

In FIG. 16, it is possible to use the invention to observe the data from the I/O pad via the input boundary scan cell (bottom cell). It is also possible to observe the IC core output data via the output boundary scan cell (middle cell). Further, it is possible to observe the enable output from the IC core via the enable boundary scan cell (top cell). Since the input boundary scan cell observes the I/O pad data, it actually provides observation of both input and output data flow through the I/O pad. Realizing that the IC output data observable by the output boundary scan cell is a subset of the I/O data observable from the input boundary scan cell, it is possible to optimize the boundary scan cell and observation circuitry as shown in FIG. 17.

Figure 17:
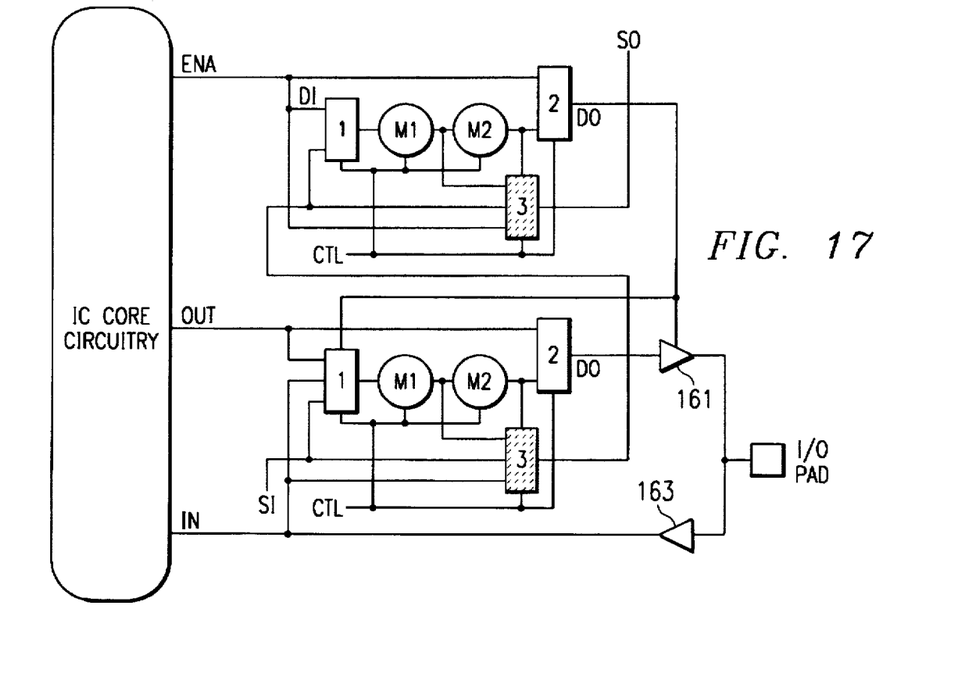

In FIG. 17 the input boundary scan cell has been removed from the I/O pad. Also, multiplexer 1 of the output boundary scan cell has an additional input to receive the data from the I/O pad and an additional control input from the enable boundary scan cell output. The additional control input determines whether output data from the IC core or the data from the I/O pad is captured into M1 via multiplexer 1 during traditional boundary scan testing. Further, multiplexer 3 of the output boundary scan cell has the data from the I/O pad connected as the observation data instead of the output data from the IC core as shown in FIG. 16.

In the optimized boundary scan cell arrangement of FIG. 17 it is seen that only the IC enable output, or the data appearing at the I/O pad are real time observable using the invention. However, since the data appearing at the I/O pad is both input data to and output data from the IC, no loss in data observation results from the circuit optimization shown in FIG. 17 compared to the non-optimized circuit shown in FIG. 16.

Although exemplary embodiments of the present invention are described above, this description does not limit the scope of the invention, which can be practiced in a variety of embodiments.

What is claimed is:

1. A method of operating a plurality of series-connected scan cells, each scan cell operable to capture and scan signals from a target circuit to be observed, comprising the steps of:

placing one of the scan cells in an observation mode wherein scanning operation thereof is disabled and wherein a data node thereof which is connected to the target circuit is also connected directly to a scan output of said one scan cell to permit the target circuit to drive the scan output directly via the data node;

placing another of the scan cells in a bypass mode wherein a scan output thereof is connected directly to a scan input thereof, so that said one scan cell is in the observation mode while said another scan cell is in the bypass mode; and observing, at the scan output of said another scan cell, signal activity occurring at the data node of said one scan cell while said one scan cell is in the observation mode with scanning operation thereof disabled.

2. The method of claim 1, wherein said first-mentioned placing step includes scanning configuration information through the plurality of series-connected scan cells.

3. The method of claim 1, wherein said last-mentioned placing step includes scanning configuration information through the plurality of series-connected scan cells.

4. The method of claim 1, wherein both of said placing steps include scanning configuration information through the plurality of series-connected scan cells.

5. The method of claim 1, wherein said another scan cell is adjacent the one scan cell in the series-connected plurality of scan cells.

6. The method of claim 5, wherein said observing step includes passing the signal activity through both of said scan cells.

7. The method of claim 1, including placing in the bypass mode each of a group of consecutive scan cells within the plurality of series-connected scan cells, the group including said another scan cell.

8. The method of claim 7, wherein said observing step includes passing the signal activity through said one scan cell and each scan cell of the group.

9. The method of claim 1, wherein the data node is a data input of said one scan cell.

10. A scan cell, comprising:

a scan input;

a data input connected to a target circuit to be observed;

a scan output;

a memory circuit connected between said scan input and said scan output and also connected between said data input and said scan output; and said data input directly connectable to said scan output.

11. The scan cell of claim 10, wherein said scan cell is a boundary scan cell.

12. The scan cell of claim 11, wherein said target circuit includes a bond pad of an integrated circuit, and wherein said data input is connected to said bond pad during normal operation of said target circuit.

13. The scan cell of claim 10, wherein said memory circuit is part of the target circuit.

14. The scan cell of claim 10, including a multiplexer having a first data input connected to said scan input, having a second data input connected to an output of said memory circuit, having a third data input connected to said first-mentioned data input and having a data output connected to said scan output.

15. The scan cell of claim 14, including a further memory circuit having an input connected to said output of said first-mentioned memory circuit and having an output connected to a control input of said multiplexer.

16. The scan cell of claim 15, wherein said further memory circuit includes a bus holder circuit and a switch connected between said bus holder circuit and said input of said further memory circuit.

17. The scan cell of claim 14, wherein said memory circuit output is connected to a control input of said multiplexer.

18. The scan cell of claim 10, including a multiplexer having a first data input connected to said first-mentioned data input, having a second data input connected to said scan input, and having a data output connected to an input of said memory circuit.

19. Electronic circuitry, comprising:

a plurality of interconnected circuits, each said circuit including functional circuitry for performing normal operating functions of the circuit, and each said circuit including a scan path for communication with said functional circuitry, said scan path having a scan input and a scan output;

said scan output of a first said circuit connectable to said scan input of a second said circuit, and said scan output of said second circuit connectable to said scan input of a third said circuit; and each of said scan outputs of said first and second circuits also connectable to a single node which is separate from said scan inputs of said second and third circuits.

20. The circuitry of claim 10, wherein said circuits are integrated circuits.

21. A scan cell, comprising:

a scan input;

a data input connected to a target circuit to be observed;

a scan output;

a memory circuit having an output coupled to said scan output, and having an input;

a selector connected between said scan input and said memory circuit input and also connected between said data input and said memory circuit input, said selector operable to connect either selected one of said scan input and said data input to said memory circuit input in response to a scan control signal that indicates which of said scan input and said data input is selected for connection to said memory circuit input; and said scan input directly connectable to said scan output via a direct connection that is independent of said memory circuit, said direct connection including a switch which breaks said direct connection in response to selection of said scan input by said scan control signal.

22. The scan cell of claim 21, wherein said switch is further operable in response to selection of said scan input by said scan control signal to connect said memory circuit output to said scan output.

23. The scan cell of claim 22, wherein said switch is a multiplexer having a control input coupled to said scan control signal.

* * * * *